United States Patent
Hashiguchi

(10) Patent No.: US 9,110,261 B2
(45) Date of Patent: Aug. 18, 2015

(54) OPTICAL MODULE AND OPTICAL TRANSMISSION MODULE

(71) Applicant: Japan Aviation Electronics Industry, Limited, Tokyo (JP)

(72) Inventor: Osamu Hashiguchi, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 216 days.

(21) Appl. No.: 13/679,091

(22) Filed: Nov. 16, 2012

(65) Prior Publication Data
US 2013/0188905 A1    Jul. 25, 2013

(30) Foreign Application Priority Data

Jan. 19, 2012  (JP) ................................ 2012-008719

(51) Int. Cl.
*G02B 6/12*    (2006.01)
*G02B 6/42*    (2006.01)
*H05K 1/18*    (2006.01)

(52) U.S. Cl.
CPC .............. *G02B 6/423* (2013.01); *G02B 6/428* (2013.01); *G02B 6/4279* (2013.01); *G02B 6/4202* (2013.01); *G02B 6/4243* (2013.01); *G02B 6/4246* (2013.01); *H05K 1/18* (2013.01); *H05K 2201/10446* (2013.01)

(58) Field of Classification Search
CPC .. G02B 6/4255; G02B 6/4259; G02B 6/4274; G02B 6/4278; G02B 6/428; G02B 6/4281; G02B 6/4283; G02B 6/4284; G02B 6/4279; H01L 27/0694

See application file for complete search history.

(56) References Cited

U.S. PATENT DOCUMENTS

| 5,434,939 | A  |   | 7/1995 | Matsuda |
| 5,522,002 | A  | * | 5/1996 | Chun et al. ..................... 385/88 |
| 5,606,182 | A  | * | 2/1997 | Yoshida et al. ................. 257/99 |
| 7,258,264 | B2 | * | 8/2007 | Ice et al. .................. 228/180.21 |
| 7,355,862 | B2 | * | 4/2008 | Shirai et al. .................... 361/760 |
| 7,473,107 | B2 | * | 1/2009 | Ice ................................. 439/79 |

(Continued)

FOREIGN PATENT DOCUMENTS

| CN | 1645172 A | 7/2005 |
| CN | 1667440 A | 9/2005 |

(Continued)

OTHER PUBLICATIONS

China Office action with English-language translation, mail date is Jun. 26, 2014.

(Continued)

*Primary Examiner* — Rhonda Peace
(74) *Attorney, Agent, or Firm* — Greenblum & Bernstein, P.L.C.

(57) ABSTRACT

An optical module is provided in which at least one of a surface light emitting device and a surface light receiving device is mounted on a positioning component on which optical fibers are positioned and mounted. The positioning component is made of an insulating resin and a plurality of lead frames that provide electrical connection are molded integrally with the positioning component. Each of the lead frames is flat plate and the plate surface of each of the lead frames serves as a first electrical connection surface and an edge face of each of the lead frames serves as a second electrical connection surface. The interconnection structure is simple and linear and is advantageous in high-frequency signal transmission.

6 Claims, 8 Drawing Sheets

(56) References Cited

U.S. PATENT DOCUMENTS

| | | | |
|---|---|---|---|
| 7,618,200 B2* | 11/2009 | Sakurai et al. | 385/89 |
| 7,883,278 B2* | 2/2011 | Ueno et al. | 385/93 |
| 8,608,390 B2* | 12/2013 | Saitou | 385/92 |
| 2005/0208789 A1* | 9/2005 | Shirai et al. | 439/66 |
| 2005/0247759 A1* | 11/2005 | Ice et al. | 228/180.21 |
| 2006/0127017 A1 | 6/2006 | Saito et al. | |
| 2006/0252313 A1* | 11/2006 | Ice | 439/736 |
| 2008/0067654 A1* | 3/2008 | Sakaguchi | 257/680 |
| 2008/0085077 A1* | 4/2008 | Miyanari et al. | 385/35 |
| 2008/0123198 A1* | 5/2008 | Fujita | 359/709 |
| 2010/0074573 A1 | 3/2010 | Yoshikawa | |
| 2013/0188905 A1* | 7/2013 | Hashiguchi | 385/14 |
| 2013/0279861 A1* | 10/2013 | Hashiguchi | 385/89 |

FOREIGN PATENT DOCUMENTS

| | | |
|---|---|---|
| CN | 1695075 A | 11/2005 |
| CN | 1988759 A | 6/2007 |
| CN | 101131983 A | 2/2008 |
| CN | 202585521 U | 12/2012 |
| JP | 2006-059867 | 3/2006 |
| JP | 2007-013040 | 1/2007 |
| JP | 2009-063420 | 3/2009 |
| JP | 2009-069204 | 4/2009 |
| JP | 2010-078806 | 4/2010 |

OTHER PUBLICATIONS

Japanese Office Action in JP 2012-008719 with English language translation, mail date is Jun. 2, 2015.

* cited by examiner

OPTICAL MODULE AND OPTICAL TRANSMISSION MODULE

TECHNICAL FIELD

This invention relates to an optical module including optical fibers and a surface light emitting device and/or a surface light receiving device optically connected to the optical fibers and, to an optical transmission module configured with the optical module.

BACKGROUND ART

FIG. 1 illustrates a configuration of a conventional optical transmission module of this type described in Japanese Patent Application Laid Open No. 2006-59867 (issued on Mar. 2, 2006). An optical module 10 in that example includes a ferrule 11, an electrical interconnect (extraction electrode) 12, a surface light emitting device 13, optical-device mounting bumps 14, an optical fiber 15, a transparent resin 16 and a light-absorbing resin 17. An optical device driving IC 22 is mounted on an interconnection substrate 21 and the optical module 10 is mounted on the interconnection substrate 21 to form an optical transmission module. The optical device driving IC 22 and the optical module 10 in this example are flip-chip mounted. Connection bumps 23, a flip-chip mounting underfill material 24, and a heatsink 25 are also depicted in FIG. 1.

The optical fiber 15 is positioned and held in a ferrule 11. The electrical interconnect 12 is implemented by a thin-film electrode and formed by a method such as sputtering. The electrical interconnect 12 extends from the device mounting surface of the ferrule 11 onto one side surface of the ferrule 11 that faces the interconnection substrate 21. The surface light emitting device 13 is mounted on the electrical interconnect 12 through optical-device mounting bumps 14.

Required electronic interconnects (not depicted) are formed on the interconnection substrate 21 and the optical device driving IC 22 and the optical module 10 are mounted on the electrical interconnects through the connection bumps 23.

SUMMARY OF THE INVENTION

In the configuration of the optical module 10 illustrated in FIG. 1, the optical fiber 15 extends in parallel with the plate surface of the interconnection substrate 21, the surface light emitting device 13 is mounted so as to face an end face of the optical fiber 15, and the electrical interconnect 12 is extended on the two faces across the edge of the ferrule 11 in order to electrically connecting the surface light emitting device 13 with the interconnection substrate 21. The electrical interconnect 12, which is a thin film formed by a method such as sputtering, is not easy to form and tends to break at the portion at the edge due to its structure that extends across the edge.

Furthermore, the electrical interconnect 12, which is bent at a right angle across the edge, has a long wiring line length and the bending itself is a disadvantage in high-frequency signal transmission.

An object of this invention is to provide an optical module that has an interconnection structure that is linear, is therefore easy to form, does not tend to break, and is advantageous in high-frequency signal transmission. Another object of this invention is to provide an optical transmission module using the optical module.

According to this invention, an optical module is provided in which at least one of a surface light emitting device and a surface light receiving device is mounted on a positioning component on which optical fibers are positioned and mounted. The positioning component is made of an insulating resin and a plurality of lead frames that provides electrical connection are molded integrally with the positioning component. The lead frames are flat plates, a surface of each of the plates is used as a first electrical connection surface, and an edge face of each of the lead frames is used as a second electrical connection surface.

An optical transmission module according to a first aspect of this invention includes the optical module described above and a substrate on which an IC to be connected to an optical device included in the optical module is mounted, wherein the positioning component is fixed on the substrate and the second electrical connection surface and the IC are interconnected by wire bonding.

An optical transmission module according to a second aspect of this invention includes the optical module described above and a substrate on which an IC to be connected to an optical device of the optical module is mounted, wherein the positioning component is fixed on the substrate and the second electrical connection surface is connected to an electrode of the substrate.

According to this invention, electrical interconnects are, rather than being made of a thin film and having a structure extending across an edge as in the past, implemented by flat-plate lead frames inserted in and molded integrally with the positioning component on which optical fibers are to be positioned and mounted, and two mutually perpendicular surfaces (a plate surface and an edge face) of each of the lead frames are used as electrical connection surfaces. Accordingly, the interconnection structure is considerably simple and, unlike a thin-film interconnect, does not break.

In addition, since the lead frames described above provide a linear interconnection structure having a shorter wiring length than a structure that extends across an edge, the lead frames are advantageous in high-frequency signal transmission.

DETAILED DESCRIPTION OF THE EMBODIMENTS

Figure 1:
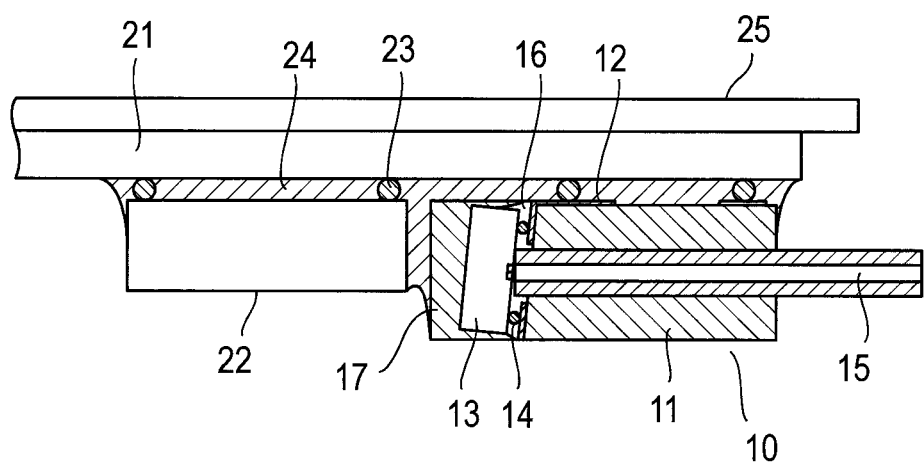
FIG. 1 is a cross-sectional view of an example of a conventional optical transmission module.

Embodiments of this invention will be described below.

First Embodiment

FIGS. 2A to 2C and FIGS. 3A to 3C illustrate a configuration of a positioning component of an optical module according to this invention.

The positioning component 30 is made of an insulating resin and has a rectangular outline. Two grooves 31 and 32 for positioning and mounting optical fibers extend between the opposed longer sides in the upper surface of the positioning component 30. Sunken stages 33 and 34 are formed on both sides of the groove 31 and 32 in the direction of the longer sides.

Metal lead frames 41 to 45 are inserted in and molded integrally with a portion along one of the longer sides of the positioning component 30. Each of the lead frames 41 to 45 is a flat plate. Plate surfaces 41d, 42d, 43d, 44d and 45d of the lead frames 41 to 45 are perpendicular to the direction in which the grooves 31 and 32 extend. A recess 35 is formed in the bottom 30a of the positioning component 30 in the region where the lead frames 41 to 45 are located.

Figure 3A:
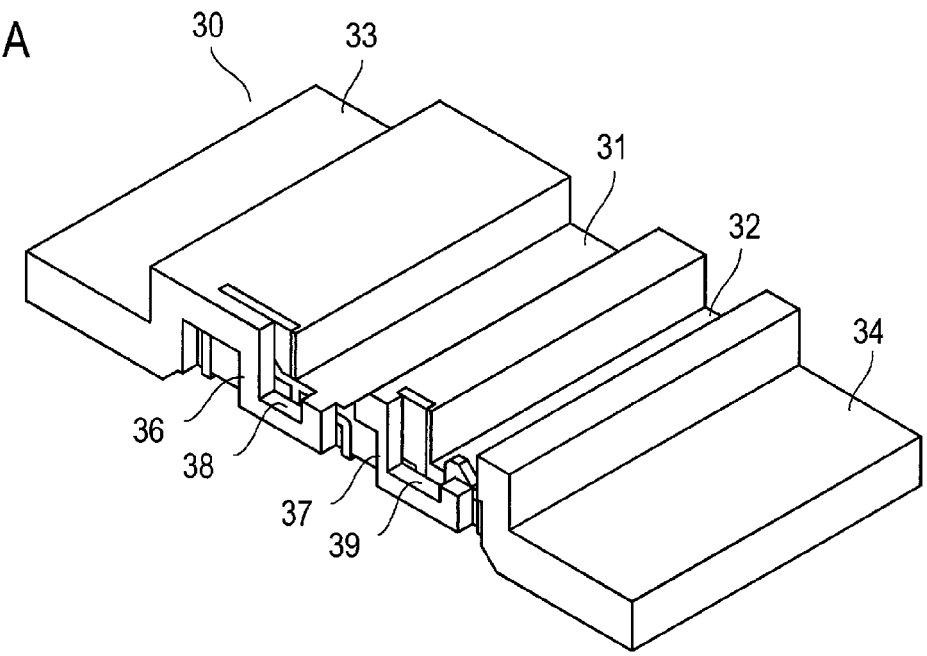
FIG. 3A is a perspective view of the positioning component illustrated in FIG. 2A.
Figure 3B:
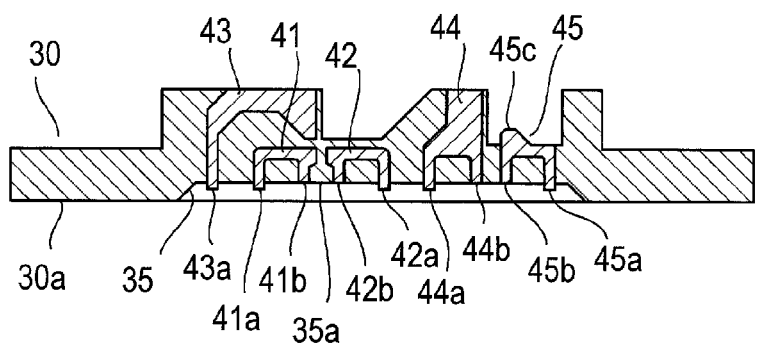
FIG. 3B is a cross-sectional view of FIG. 2A taken along line D-D.
Figure 3C:
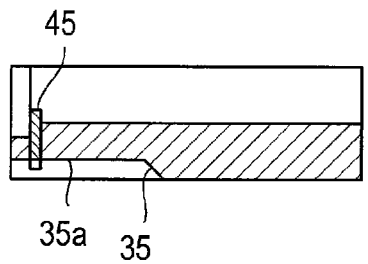
FIG. 3C is a cross-sectional view of FIG. 2B taken along line E-E.

The lead frames 41, 42 and 45 are substantially U-shaped as illustrated in FIG. 3B and are disposed in such a manner that the middle section of the U is in parallel to the bottom 30a of the positioning component 30 and both legs of the U point to the bottom 30a. The lower edge face 41a, 42a, 45a of one leg of each of the lead frames 41, 42 and 45 protrudes from the bottom 35a of the recess 35 and the lower edge face 41b, 42b, 45b of the other leg is located on the same plane as the bottom 35a. A protrusion 45c protruding upward is formed in one-half portion of the middle section of the U of the lead frame 45.

The lead frame 43 is L-shaped, one side of the L is positioned above the lead frame 41 and the other side extends downward. The lower edge face 43a of the side of the lead frame 43 that extends downward protrudes from the bottom 35a of the recess 35. The end portion of one side of the L shape of the lead frame 43 is widened as illustrated in FIG. 3B.

The lower half of the lead frame 44 is substantially U-shaped like the lead frames 41 and 42 and the middle section of the U extends upward. The lower edge face 44a of one of the legs of the U of the lead frame 44 protrudes from the bottom 35a of the recess 35 and the lower edge face 44b of the other leg is on the same plane as the bottom 35a of the recess 35.

The lower edge faces 41a, 42a, 43a, 44a and 45a of the lead frames 41 to 45 which have the shape described above form bridge cut surfaces after insert molding.

Figure 2A:
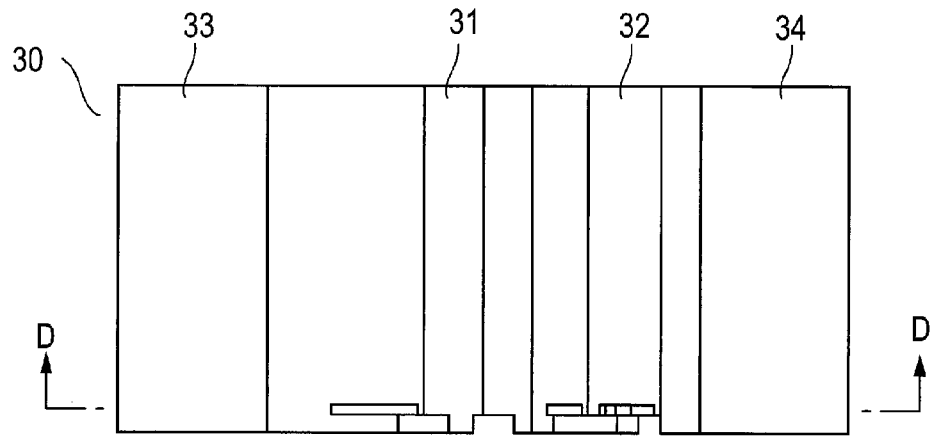
FIG. 2A is a plan view illustrating a configuration of a positioning component in a first embodiment of an optical module according to this invention.
Figure 2B:
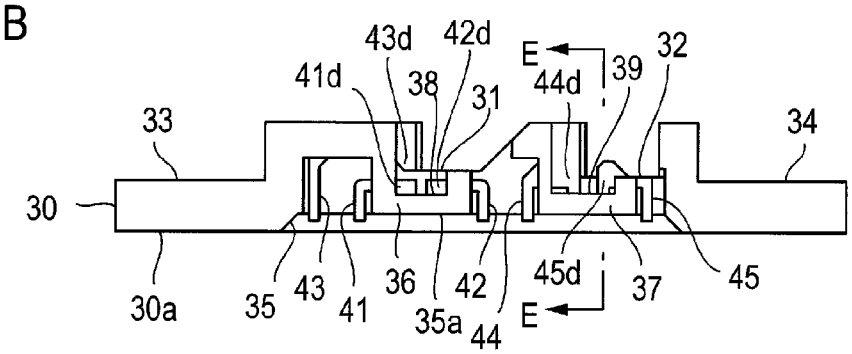
FIG. 2B is a front view of the positioning component illustrated in FIG. 2A.
Figure 2C:
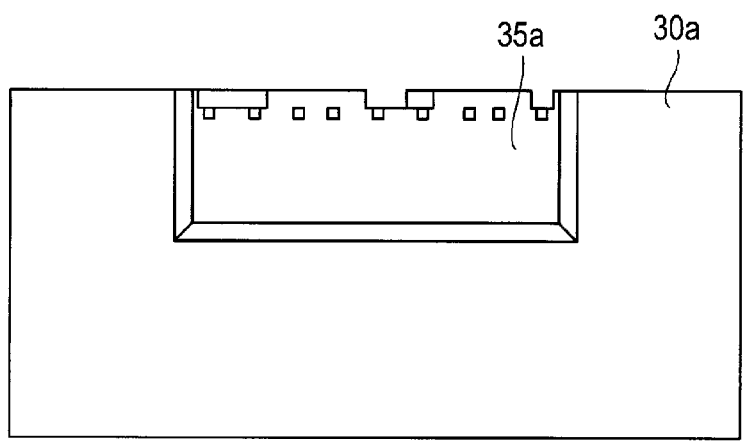
FIG. 2C is a bottom view of the positioning component illustrated in FIG. 2A.

Holding parts 36 and 37 are formed along the longer side of the positioning component 30 where the lead frames 41 to 45 are located so as to be positioned on the plate surfaces of the lead frames 41 to 45. Both of the holding parts 36 and 37 have the shape of a crank as illustrated in FIG. 2B.

The holding part 36 is positioned to cover part of each of the lead frames 41 to 43 and is formed in such a manner that the upper end portions of the lead frames 41 and 42 that are close to each other and the top end side of the lead frame 43 are exposed. The exposed portions of the three lead frames 41 to 43 that are close to each other are used as a device mounting part 38.

The holding part 37, on the other hand, is positioned to cover part of each of the lead frames 44 and 45 and is formed in such a manner that the upper portions of the lead frames 44 and 45 that are close to each other are exposed. The exposed portions of the two lead frames 44 and 45 that are close to each other are used as a device mounting part 39.

Figure 4A:
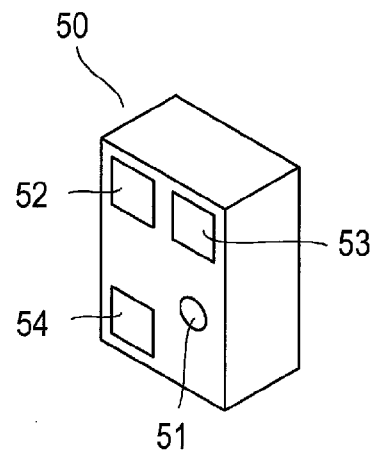
FIG. 4A is a perspective view of a surface light emitting device.
Figure 4B:
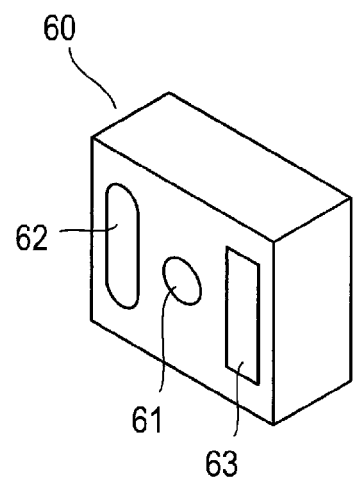
FIG. 4B is a perspective view of a surface light receiving device.

FIGS. 4A and 4B illustrate optical devices to be mounted on the device mounting parts 38, 39. FIG. 4A illustrates a surface light emitting device and FIG. 4B illustrates a surface light receiving device. The surface light emitting device 50 may be a VCSEL (Vertical Cavity Surface Emitting Laser) and the surface light receiving device 60 may be a PD (Photo Diode), for example. In FIG. 4A, a light emitting surface 51 and electrodes 52 to 54 are depicted. In FIG. 4B, a light receiving surface 61 and electrodes 62 and 63 are depicted. The electrode 54 of the surface light emitting device 50 is a dummy electrode for mechanically fixing the surface light emitting device 50 on the lead frame.

Figure 5:
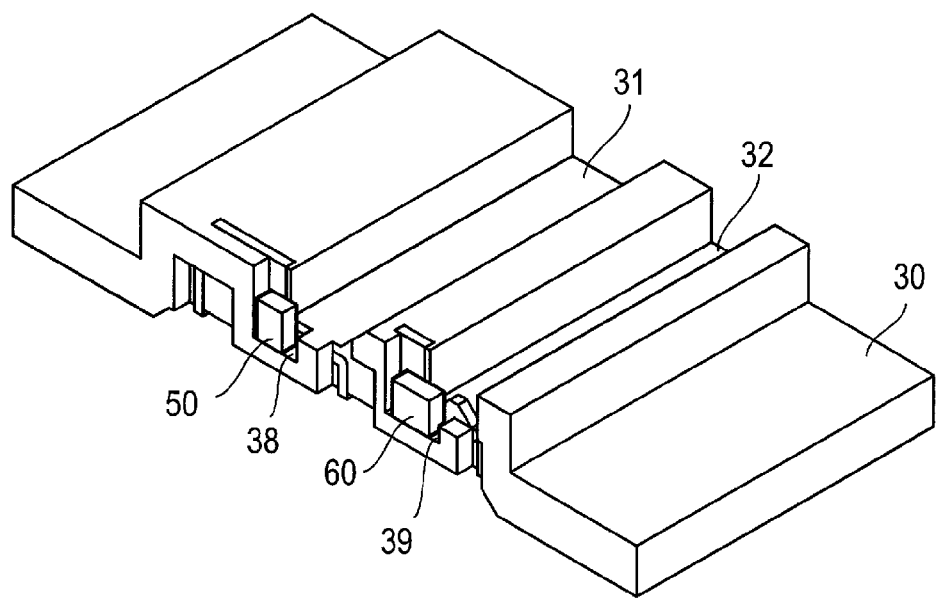
FIG. 5 is a perspective view illustrating the surface light emitting device and the surface light receiving device mounted on the positioning component illustrated in FIG. 3A.

FIG. 5 illustrates a surface light emitting device 50 and a surface light receiving device 60 mounted on the positioning component 30. The surface light emitting device 50 is located on the device mounting part 38. The electrodes 52 to 54 are connected to the plate surfaces 41d, 42d and 43d of the lead frames 41 to 43, respectively, by soldering, for example. The surface light receiving device 60 is located on the device mounting part 39. The electrodes 62 and 63 are connected to the plate surfaces 44d and 45d of the lead frames 44 and 45, respectively, by soldering. The surface light emitting device 50 and the surface light receiving device 60 are positioned and mounted in such a manner that end faces of optical fibers positioned and mounted in the grooves 31 and 32 of the positioning components 30 face the light emitting surface 51 and the light receiving surface 61, respectively.

Figure 6:
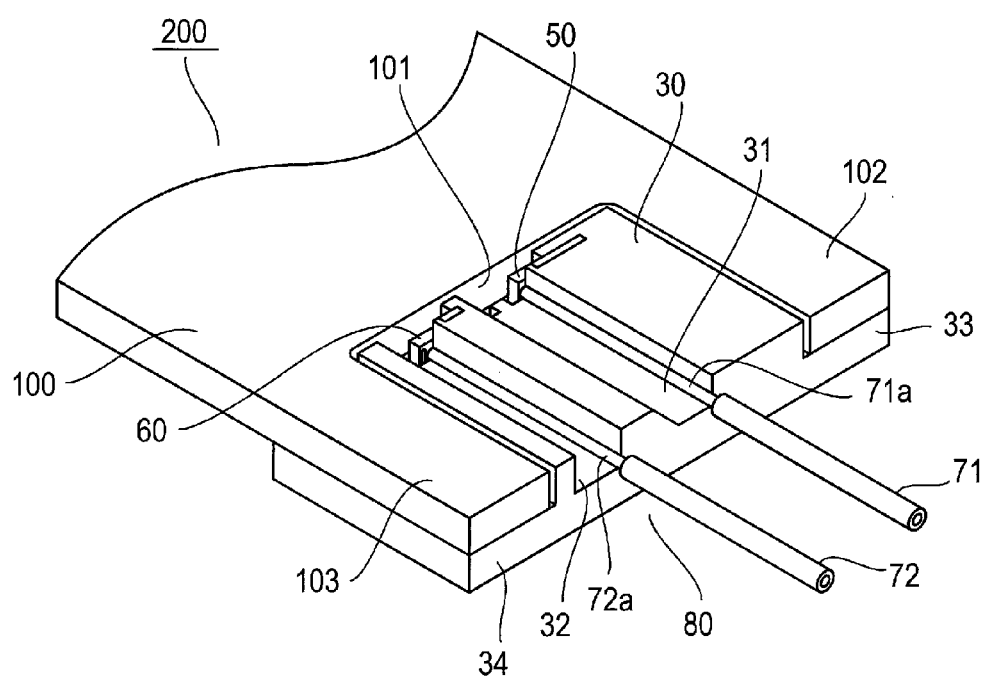
FIG. 6 is a perspective view of an optical transmission module configured with the first embodiment of the optical module according to this invention.
Figure 7A:
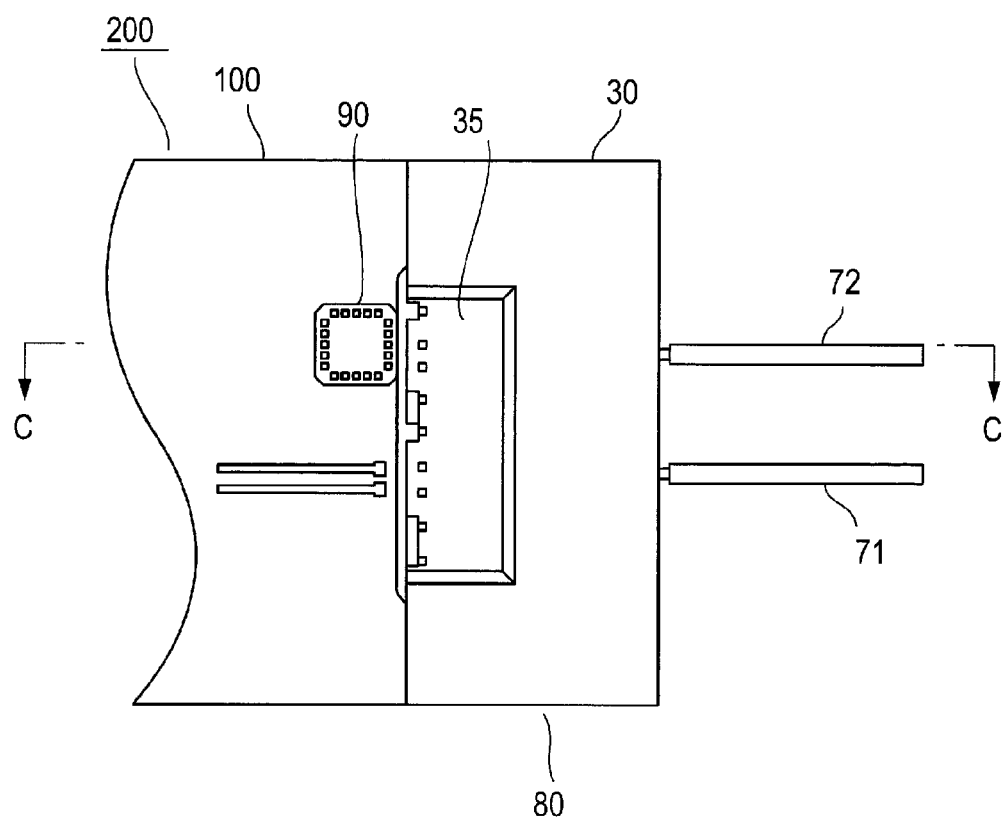
FIG. 7A is a bottom view of the optical transmission module illustrated in FIG. 6.
Figure 7B:
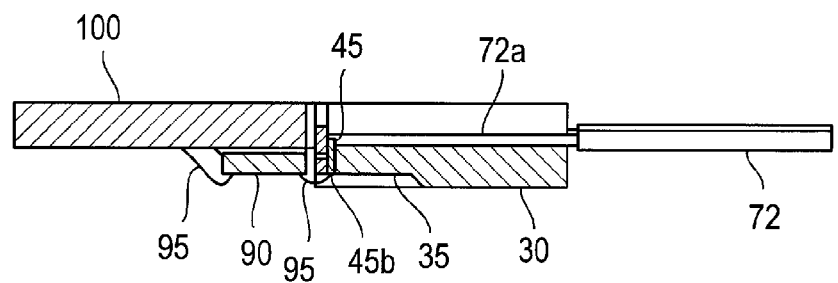
FIG. 7B is a cross-sectional view of FIG. 7A taken along line C-C.

FIGS. 6, 7A and 7B illustrate a configuration of an optical transmission module 200 in which an optical module 80 and a substrate 100 on which an IC 90 is mounted are fixed and integrated with each other. In the optical module 80, bare fibers 71a and 72a of optical fibers 71 and 72 are positioned and mounted in the grooves 31 and 32 of the positioning component 30 on which the surface light emitting device 50 and the surface light receiving device 60 illustrated in FIG. 5 are mounted. The bare fibers 71a and 72a of the optical fibers 71 and 72 are positioned and mounted in the grooves 31 and 32, respectively, so as to abut against two mutually perpendicular surfaces of the grooves 31 and 32.

A notch 101 is formed at an end of the substrate 100 and arm parts 102 and 103 at each side of the notch 101 are positioned on the sunken stages 33 and 34 of the positioning component 30 and bonded to the sunken stages 33 and 34. In this example, the IC 90 is located on the back side of the substrate 100.

Electrodes of the IC 90 and electrodes (not depicted) formed on the substrate 100 are connected with each other by wire bonding as illustrated in FIG. 7B. Similarly, electrode of the IC 90 and lower edge faces of the corresponding lead frames are connected each other by wire bonding. FIG. 7B illustrates how the lower edge face 45b of the lead frame 45 and an electrode of the IC 90 are connected with each other by wire bonding. In FIG. 7B, a boding wire 95 is depicted. Bonding wires are omitted from FIG. 7A. Among ICs, only the IC 90 for the surface light receiving device 60, that is, the IC 90 connected to the surface light receiving device 60, is illustrated in FIG. 7A. The IC 90 may be a trans-impedance amplifier (TIA), for example.

The lower edge faces of the lead frames used for the wire bonding are the lower edge faces 41b, 42b, 44b and 45b located in the same plane as the bottom 35a of the recess 35 of the positioning component 30. Using the lower edge faces that are not bridge cut surfaces enables good wire bonding.

As has been described, according to this example, flat-plate-like lead frames inserted in and molded with the positioning component 30 form electronic interconnects, the surfaces of the flat plates are used as a first electrical connection surface on which an optical element is mounted, and one edge face (lower edge face) of each lead frame is used as a second electrical connection surface for connecting with an IC mounted on the substrate 100. Accordingly, the interconnection structure is linear, is easy to form, does not tend to break and, in addition, is advantageous in high-frequency signal transmission.

Second Embodiment

Figure 8:
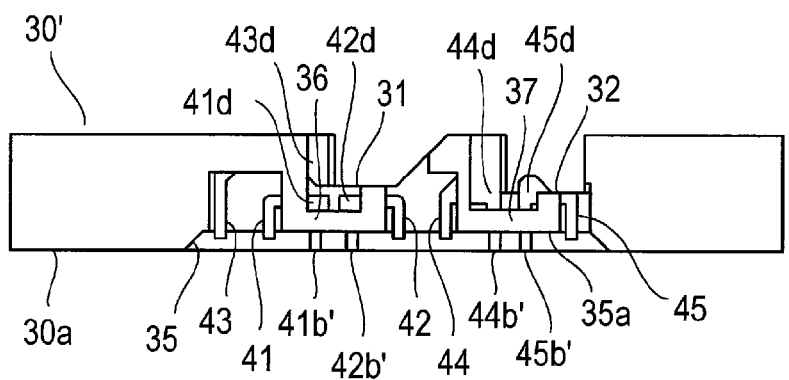
FIG. 8 is a front view illustrating a configuration of a positioning component in a second embodiment of an optical module according to this invention.

FIG. 8 illustrates a configuration of a positioning component in a second embodiment of an optical module according to this invention. The positioning component 30' in this example does not include the sunken stages 33 and 34 at both sides of the top surface of the positioning component 30 of the first embodiment. Furthermore, the lower edge faces 41b', 42b', 44b' and 45b' of lead frames 41, 42, 44 and 45 that serve as a second electrical connection surface are extended to the bottom 30a of the positioning component 30'.

Figure 9:
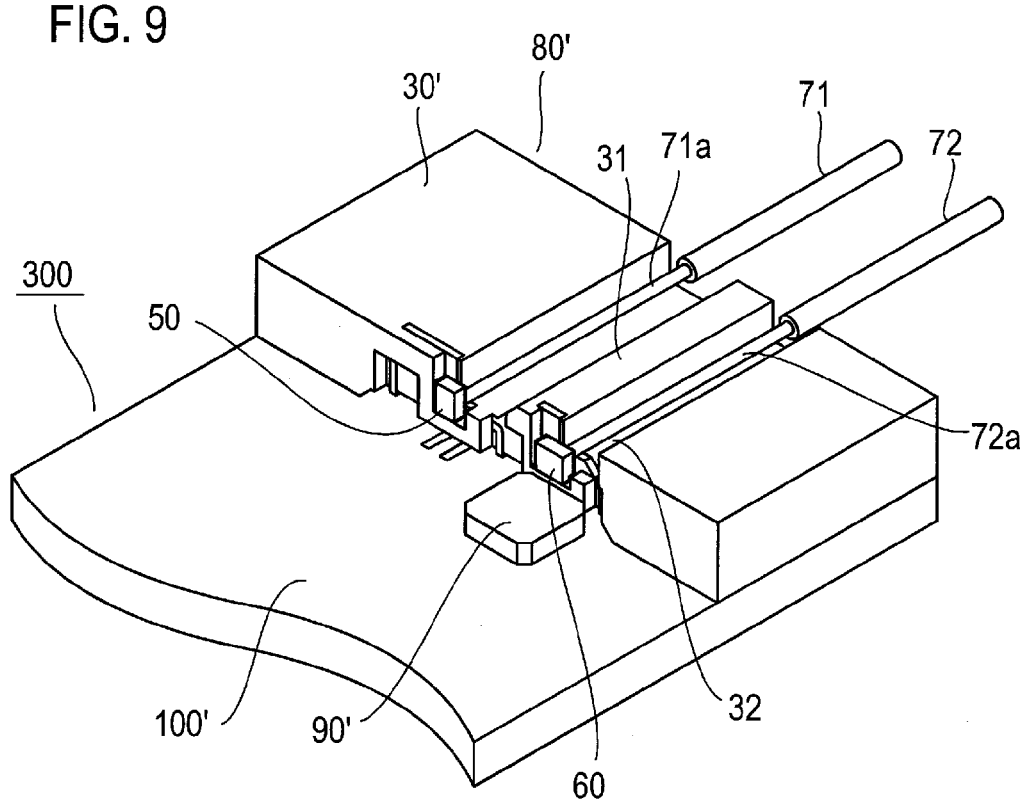
FIG. 9 is a perspective view of an optical transmission module configured with the second embodiment of the optical module according to this invention.
Figure 10A:
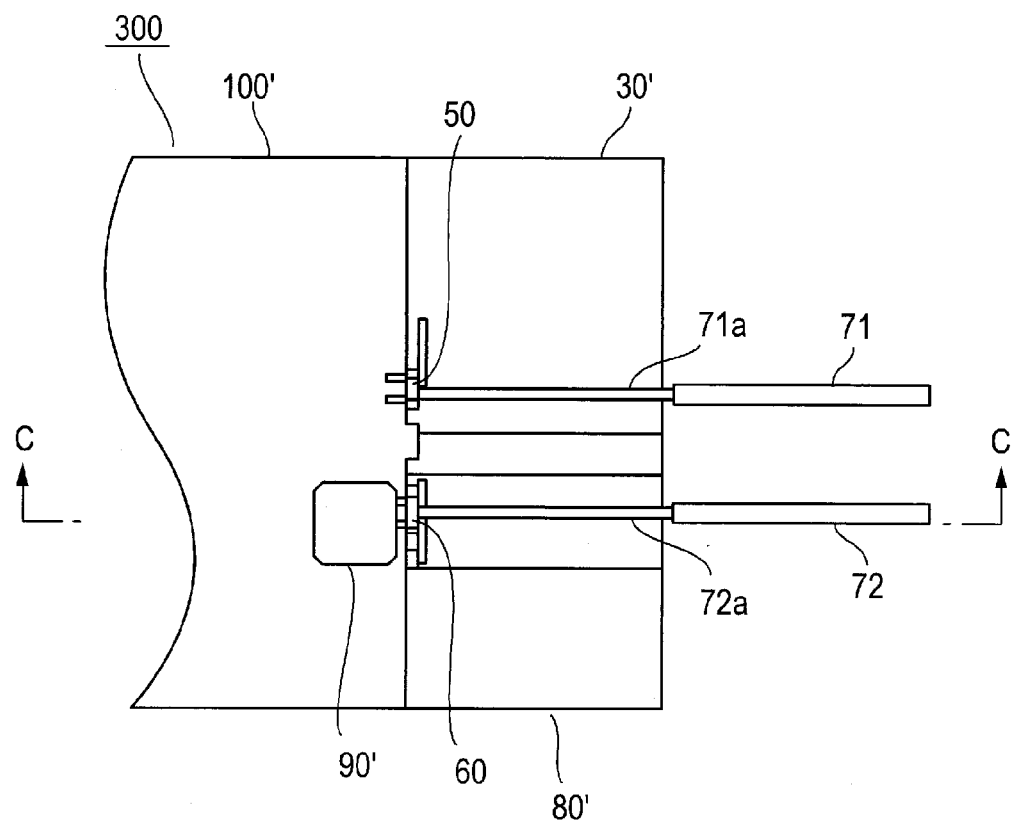
FIG. 10A is a plan view of the optical transmission module illustrated in FIG. 9.
Figure 10B:
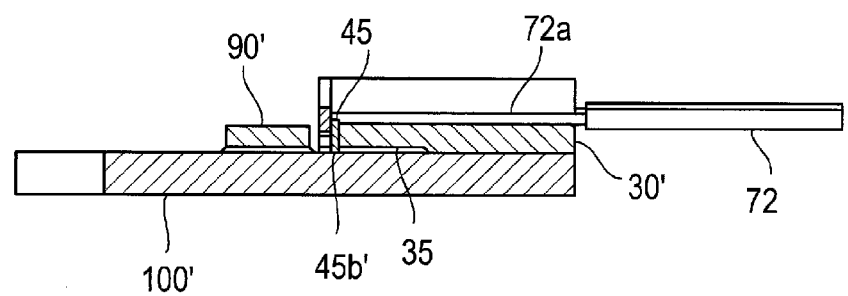
FIG. 10B is a cross-sectional view of FIG. 10A taken along line C-C.

FIGS. 9, 10A and 10B illustrate a configuration of an optical transmission module 300 in which an optical module 80' and a substrate 100' on which an IC 90' is mounted are fixed and integrated with each other. In the optical module 80', a surface light emitting device 50 and a surface light receiving device 60 are mounted in the positioning component 30' illustrated in FIG. 8 and bare fibers 71a and 72a of optical fibers 71 and 72 are positioned and mounted in grooves 31 and 32. The positioning component 30' of the optical module 80' in this example is bonded to the top surface of a substrate 100'.

The IC 90' is located on the top surface of the substrate 100' and is connected to electrodes formed on the substrate 100'. Similarly, the lead frames of the optical module 80' are connected to electrodes formed on the substrate 100'. The IC 90' and the lead frames are mounted by soldering or bare-chip mounting.

Unlike the first embodiment, this embodiment is designed in such a manner that the second electrical connection surface of the lead frames is connected to electrodes of the substrate 100' by soldering. FIG. 10B illustrates how the lower edge face 45b' of the lead frame 45 that forms the second electrical connection surface is connected to an electrode (not depicted) on the substrate 100'. In FIGS. 9, 10A and 10B, only the IC 90' connected to the surface light receiving device 60, among other ICs, is shown.

While embodiments of this invention have been described, the optical module and the optical transmission module are not limited to those including both of a surface light emitting device and a surface light receiving device. A configuration including only one of a surface light emitting device and a surface light receiving device is also possible.

What is claimed is:

1. An optical module in which an optical device that is at least one of a surface light emitting device and a surface light receiving device is mounted on a positioning component on which an optical fiber is to be positioned and mounted, wherein:
   the positioning component is made of an insulating resin and a plurality of lead frames providing electrical connection are molded integrally with the positioning component; and
   each of the lead frames is in a form of a flat plate, a plate surface of each of the lead frames serves as a first electrical connection surface on which the optical device is mounted, and an end face of each of the lead frames, which is perpendicular to the plate surface, serves as a second electrical connection surface.

2. The optical module according to claim 1, wherein the positioning component includes a groove in which the optical fiber is to be positioned and mounted and the plate surface of each of the lead frames is perpendicular to a direction in which the groove extends.

3. The optical module according to claim 2, wherein a recess is formed in a bottom of the positioning component and the second electrical connection surface is located in the recess.

4. The optical module according to claim 1, wherein a recess is formed in a bottom of the positioning component and the second electrical connection surface is located in the recess.

5. An optical transmission module comprising:
   an optical module according to any one of claims 1 to 4; and
   a substrate on which an IC to be connected to the optical device included in the optical module is mounted;
   wherein the positioning component is fixed to the substrate; and
   the second electrical connection surface and the IC are connected with each other by wire bonding.

6. An optical transmission module comprising:
   an optical module according to any one of claims 1 to 4; and
   a substrate on which an IC to be connected to the optical device included in the optical module is mounted;
   wherein the positioning component is fixed to the substrate; and
   the second electrical connection surface is connected to an electrode of the substrate.

* * * * *